United States Patent [19]
Ahlquist et al.

[11] Patent Number: 6,015,652
[45] Date of Patent: Jan. 18, 2000

[54] MANUFACTURE OF FLIP-CHIP DEVICE

[75] Inventors: Louis Nelson Ahlquist, Annandale; Yinon Degani, Highland Park, both of N.J.

[73] Assignee: Lucent Technologies Inc., Murray Hill, N.J.

[21] Appl. No.: 09/032,338

[22] Filed: Feb. 27, 1998

[51] Int. Cl.[7] ........................................ G03C 5/00
[52] U.S. Cl. .................... 430/315; 430/313; 430/328; 430/394
[58] Field of Search .................... 430/315, 328, 430/394

[56] References Cited

U.S. PATENT DOCUMENTS

| 4,224,361 | 9/1980 | Romankiw | 427/259 |
| 4,273,859 | 6/1981 | Mones et al. | 430/315 |
| 4,982,267 | 1/1991 | Mones et al. | 357/71 |
| 5,158,860 | 10/1992 | Gulla et al. | 430/315 |

OTHER PUBLICATIONS

Klose, Helmut; Sigush, Reiner; and Arden, Wolfgang. "Imaging Reversal of Positive Photoresist: Characterization and Modeling". IEEE Transactions on Electron Devices, 32, 9, 1654–1661, Sep. 1985.

*Primary Examiner*—Janet Baxter
*Assistant Examiner*—Yvette M. Clarke

[57] ABSTRACT

The specification describes a process for applying under bump metallization (UBM) for solder bump interconnections on interconnection substrates. The process uses a lift-off technique for defining the UBM and the lift-off technique has improved edge definition as the result of radiation hardening of the photoresist after lithographic patterning.

23 Claims, 2 Drawing Sheets

MANUFACTURE OF FLIP-CHIP DEVICE

FIELD OF THE INVENTION

This invention relates to methods for the manufacture of Multi Chip Module (MCM) flip-chip devices and to techniques for forming solder wettable metal contacts for flip chip bonding.

BACKGROUND OF THE INVENTION

Typical state of the art semiconductor device packaging uses high density interconnection structures in which typically unpackaged integrated circuit (IC) chips or bare die are connected both mechanically and electrically onto a single substrate of silicon, ceramic, or epoxy glass laminate. The choice of interconnection technique, substrate material, and bonding process steps e.g. cleaning, all play significant roles in defining the overall assembly technique and its influence on MCM cost and reliability. A variety of interconnection techniques have been used in the microelectronics industry to assemble bare die onto the MCM substrates. These substrates function as both structural support and as the "fabric" for the electrical interconnections between ICs. Typically MCMs are assembled using one of a variety of known techniques, i.e. wire bonding, tape automated bonding (TAB) and flip-chip soldering.

In general, the design of the MCM package depends on the particular capabilities of the manufacturer, the MCM architecture, the relative cost of materials and the required I/O configuration and density. In turn, the choice of interconnection technique and cleaning processes play a major role in defining the assembly process required for high yield, and product reliability.

The most common, and nominally the lowest cost, interconnection technique is wire bonding. However, wire bond connections have the disadvantage of having a large footprint, which results in a large substrate and a necessarily less compact MCM. As is well known in electronics manufacturing, increased size of any feature in the assembly translates directly into added cost. Moreover in an MCM module, increasing the size of the module increases the length of interconnects, leading to increased lead inductance and resistance, and a degradation in electrical performance. Furthermore, a typical wire bonding apparatus, e.g. a stitch bonder, makes bonds one at a time, a time consuming operation even with the advanced high speed bonders available today.

TAB bonding has the advantages of both a smaller footprint and of partial batch processing. However, TAB assembly generally requires different tooling for each IC design, adding significant cost to this bonding technique. Moreover, TAB assembly is restricted to interconnection of perimeter I/O arrays thus limiting the IC design flexibility. Perimeter I/O pads typically have higher pitches and correspondingly lower overall I/O densities than the area I/O arrays that can be used with flip-chip solder bonding. Also TAB bonded interconnections typically show higher capacitance and greater parasitic inductance than flip-chip bonded interconnections.

It is now recognized that flip-chip bonding provides the best performance at the highest I/O density for either perimeter or area I/O arrays. Furthermore, flip-chip bonding is inherently a batch assembly process which facilitates high speed, high through-put manufacture. However, for a variety of reasons, flip-chip MCM assembly is usually considered to be the most expensive of the known assembly techniques. This is especially true for high performance MCM designs which often use multi-layer co-fired ceramics (MCM-C), or deposited thin film ceramic or silicon substrates (MCM-D) as the interconnection substrate. The less expensive alternative is a typical printed wiring board, i.e epoxy-glass fiber laminate. However, as the I/O count and density increases in state of the art assemblies, silicon becomes more cost competitive, and represents the interconnection substrate of choice for high performance applications.

Assembly of electronics packages using flip-chip techniques is a dominant technology, especially in the manufacture of computers and computer peripherals. It is also widely used in the assembly of electronics and photonics packages for communication network products. The essence of flip-chip assembly is the attachment of semiconductor substrates "upside down" on an interconnection substrate such as a silicon wafer, ceramic substrate, or printed circuit board. The attachment means is typically solder, in the form of balls, pads, or bumps (generically referred to hereinafter as bumps). Solder bumps may be applied to the semiconductor chip, or to the interconnection substrate, or to both. In the bonding operation, the chip is placed in contact with the substrate and the solder is heated to reflow the solder and attach the chip to the substrate. For successful bonding, it is necessary that the sites to which the solder is bonded it wettable by the solder.

The metal interconnection pattern typically used for integrated circuits boards or cards is aluminum. While techniques for soldering directly to aluminum have been tried it is well known and accepted that aluminum is not a desirable material to solder. Consequently the practice in the industry is to apply a metal coating on the aluminum contact pads, and apply the solder bump or pad to the coating. The metal coating is typically referred to as Under Bump Metallization (UBM).

The metal or metals used in UBM technology must adhere well to aluminum, be wettable by typical tin solder formulations, and be highly conductive. A structure meeting these requirements is a composite of chromium and copper. Chromium is deposited first, to adhere to the aluminum, and copper is applied over the chromium to provide a solder wettable surface. Chromium is known to adhere well to a variety of materials, organic as well as inorganic. Accordingly it adheres well to dielectric materials, e.g. $SiO_2$, SINCAPS, polyimide, etc., commonly used in IC processing, as well as to metals such as copper and aluminum. However, solder alloys dissolve copper and de-wet from chromium. Therefore, a thin layer of copper directly on chromium will dissolve into the molten solder and then the solder will de-wet from the chromium layer. To insure interface integrity between the solder and the UBM, a composite or alloy layer of chromium and copper is typically used between the chromium and copper layers.

The aforementioned layers are conventionally sputtered, so several options for depositing them are conveniently available. The layer can be sputtered from an alloy target. It can be sputtered using a chromium target, then changing to a copper target. Or it can be sputtered using separate chromium and copper targets, and transitioning between the two. The latter option produces a layer with a graded composition, and is a preferred technique.

In forming the structure just described the accepted practice is to use an additive process for selective deposition of the composite layer. Additive processes are well known and are usually implemented using lift-off techniques. However, the lift-off process has an inherent incompatibility with the preferred technique for depositing the UBM, i.e. sputtering.

In sputtering, the UMB the substrate reaches temperatures exceeding 100° C. At these temperatures the photoresist used for lift-off undergoes dimensional distortion, and the edge acuity of the photoresist pattern deteriorates. Moreover, to improve adhesion of the UBM to the underlying substrate it is customary to back sputter the surface to roughen it. In this process the substrate and the photoresist are also heated to temperatures above 100° C., adding further incompatibility to the process.

SUMMARY OF THE INVENTION

According to the invention modifications are made in the process for applying the under bump metallization that permit the use of the relatively high temperatures associated with common processing steps such as sputtering, back sputtering, and ion milling. This is achieved by treating the photoresist used for lift-off, prior to high temperature processing, to dimensionally stabilize the pattern. The treatment comprises an actinic cross-linking step after the photoresist is lithographically patterned.

DETAILED DESCRIPTION

Figure 1:
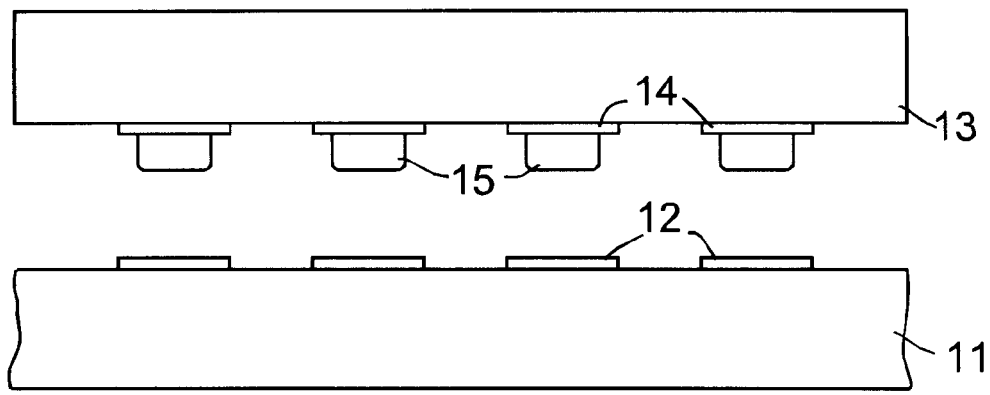
FIG. 1 is a schematic diagram of portion of an interconnection substrate and a solder bumped flip chip just prior to assembly of the chip on the substrate.

Referring to FIG. 1, a cutaway portion of a silicon interconnect substrate 11 is shown with contact pads 12 that are interconnected with runners (not shown) on the interconnect substrate. A flip chip 13 is shown with an array of I/O contact pads 14 each having a solder bump 15. The entire interconnect substrate may contain several flip-chip sites or may be an intermediate interconnect substrate supporting just the chip shown. The technology described here in general, and the invention, potentially covers a wide variety of solder mounted devices, and applies to other interconnecting substrates such as ceramic substrates and epoxy printed wiring boards. It will be understood by those skilled in the art that the solder bumps may be applied to contact pads on the flip-chip or to contact pads on the interconnection substrate, or to both. In the following description of this invention the solder bumps are applied to the flip-chip.

Figure 2:
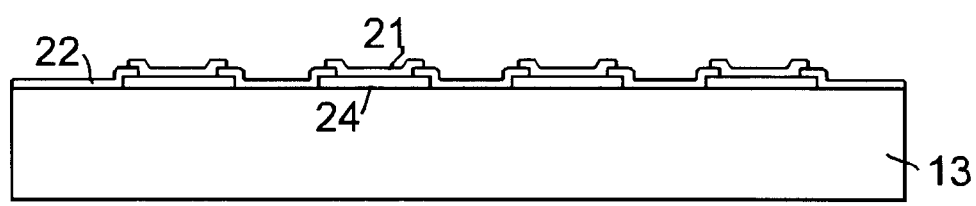
FIG. 2 is a schematic view of the flip-chip with the solder bump bonding sites provided with under bump metallization.

As described above, the contact pads on both elements to be solder joined are provided with UBM. The UBM layers are thin relative to the solder bumps and the contact pads and are not shown in FIG. 1. The UBM is shown at 21 in FIG. 2, with a thickness exaggerated for illustration. FIG. 2 also shows a typical polyimide protective layer 22 covering the aluminum runners (not shown) and a portion of the contact pads 24. The contact pads may be aluminum, copper, or other appropriate metallization material. The pads are typically formed on the field oxide of the IC (not shown) and the protective final polyimide coating 22 is deposited over the contact pads. Contact windows are formed in the polyimide layer preferably by a photodefinition process. The under bump metallization 21 is formed in the polyimide window. These aspects of IC processing are well known. The UBM layer 21 is shown as a single layer but as described above is preferably a composite layer of Cr and Cu. Alternatively it can be Ti—Pd—Au, Ti—Ni—Au, or other suitable material.

The process steps used to produce the structure of FIG. 2 according to the invention are represented by FIGS. 3–7.

Figure 3:
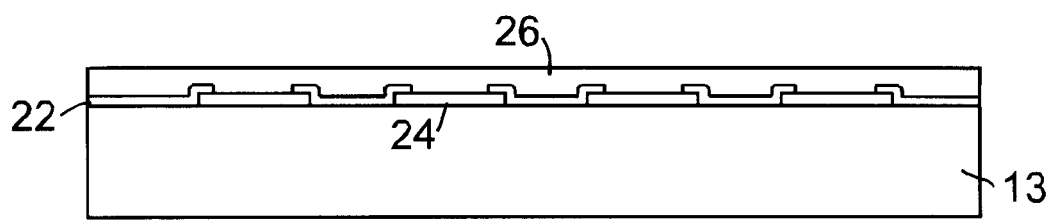
FIGS. 3–7 are schematic representations of typical process steps used to produce the under bump metallization pattern of FIG. 2 in accordance with the invention.
Figure 4:
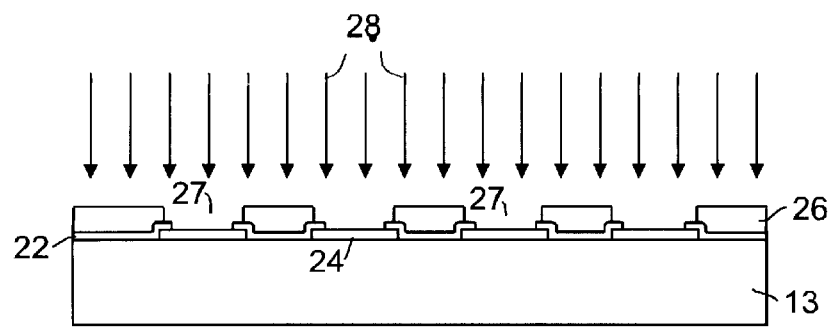

Shown in FIG. 3 is the flip-chip 13 prior to formation of the UBM. With reference to FIG. 3 a photoresist layer 26 is spin coated on the flip-chip substrate 13 using conventional means. The photoresist is patterned by lithography and windows 27 are opened over the contact pad array as shown in FIG. 4. The photoresist process used is one of several known conventional processes for lift-off. The windows in the photoresist pattern are preferably re-entrant, i.e. reverse angle, to give good edge definition after lift-off. To produce a reverse angle window, bi-level or tri-level resists are frequently used to form an undercut after developing. Another option, which requires only a single photoresist level, is to mix an additive with the photoresist to reverse the tone of the resist. When developed, the windows form with a reverse angle. A description of this photoresist technique is given in H. Klose, R. Sigush, W. Arden, "Image Reversal of Positive Photoresist: Characterization and Modeling", IEEE Transactions on Electron Devices, Vol. ED 32, No. 9, September 1985.

The photoresist material remaining after patterning the windows is then flood exposed to radiation. The radiation is represented in FIG. 4 by arrows 28. The radiation source may be any source of UV radiation. It can be the same light source used to expose the pattern. The dose, however, is substantially higher, i.e. by a factor of at least 5, and preferably by a factor of at least 20. The dose is measured in terms of total accumulated flux and will typically be in the range 10–200 joules/cm$^2$. The radiation causes the formation of free radicals in a manner similar to pattern exposure, but due to the large dose the number of free radicals is much greater, resulting in significantly more crosslinking.

As a result of the extensive crosslinking from the high UV dose the pattern is hardened and rendered sufficiently robust to withstand subsequent high temperature processing without significant dimensional distortion. The "high temperature" regime in this context is above 100° C. More details of the hardening process and the chemistry associated therewith are given by Mohondro et al, in "Photostabilization: The Process of Improvement", Future Fab International, pp. 235–247, which is incorporated herein by reference for those details.

The post lithography radiation treated wafer was then placed in a sputtering apparatus and the UBM deposited. As mentioned above, the preferred UBM is a multilayer composite of Cr and Cu. However, it will be understood that this is but one example of a variety of suitable UBM materials, any of which may be applied according to the teachings of the invention.

Figure 5:
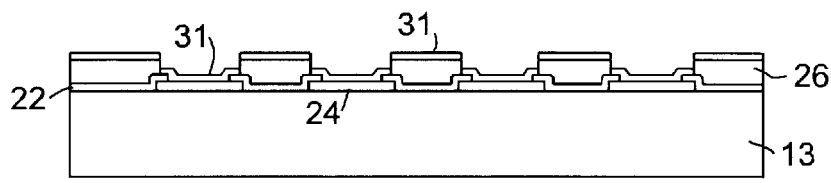

The multilayers for the UBM are deposited sequentially to form the composite layered Cr—Cr/Cu—Cu structure. The composite UBM is represented in FIG. 5 as a single layer 31. The UBM layer deposits on the contact pads 24 exposed in the windows, and on top of the photoresist layer 26 as shown.

In a preferred embodiment the individual layers are sputtered in a sputtering apparatus containing both a chromium target and a copper target. Sputtering techniques are well known and the details are not necessary for this description.

The first layer is chromium with a thickness of the order of 500–5000 Angstroms and preferably 1000–3000 Angstroms. Chromium adheres well to the aluminum contacts 24 and also adheres to the dielectric layers present in the structure. It also is refractory and forms a corrosion resistant interface with the aluminum contact. The second layer is a thin transition layer of Cr/Cu to provide a solder wettable and a metallurgically sound interface between the chromium layer and the subsequently formed copper layer. As mentioned above, layer 31 is preferably formed by sputtering in an apparatus with both chromium and copper targets, and transitioning between the targets. This results in a co-sputtered layer with a composition varying between pure chromium and pure copper. The thickness of the transition layer is of the order of 1000–5000 Angstroms, and preferably 2000–3000 Angstroms.

The next layer is a copper layer with a thickness of the order of 1000–10000 Angstroms, and preferably 2000–6000 Angstroms. The copper layer is wettable with solder materials commonly used for the solder bumps. The melting point of most copper eutectics with tin solders is relatively low, and at the soldering temperature the surface of the copper layer dissolves in the solder bump forming a physically and electrically sound bond. Even if all the copper dissolves into the solder layer the solder will still adhere and wet the Cr/Cu layer.

An optional layer of gold may be applied to the surface of the copper layer to inhibit oxidation of the copper surface. The optional gold layer has a thickness of 500–3000 Angstroms, and preferably 1000–2000 Angstroms.

Figure 6:
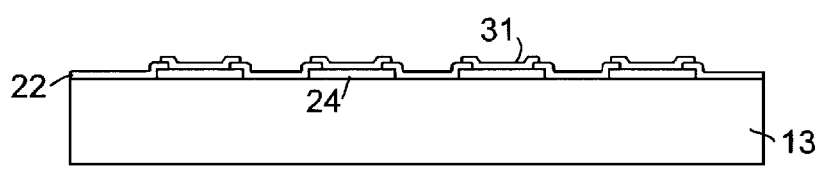
Figure 7:
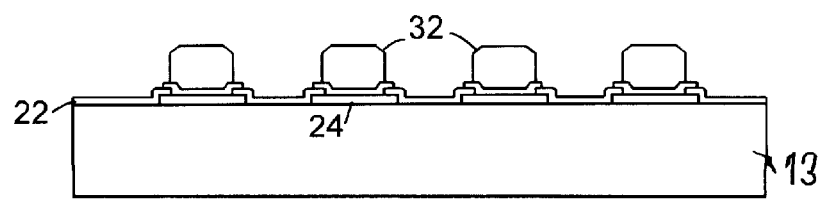

After deposition of the UBM layer 31, the unwanted portions of the layer are removed using lift-off by dissolving the photoresist layer in a photoresist solvent such as acetone. The resulting structure after lift-off is shown in FIG. 6.

Solder bumps 32 are then deposited over the UMB layer a suitable technique such as evaporation. The thickness of a typical solder bump is 10–20 mils. Examples of solder compositions that can be used successfully in the processes described above are:

|    | I  | II | III |
|----|----|----|-----|
| Sn | 5  | 63 | 95  |
| Pb | 95 | 37 | 0   |
| Sb | 0  | 0  | 5   |

To demonstrate the dimensional stabilization process of the invention the following procedure was followed.

One gram of Imidazole was mixed with 100 ml of Hoechst AZP-4620 Positive Photo resist. The mixture was heated to 40° C., removed from the hot plate and stirred without heat for 45 minutes. The solution was spin-coated at room temperature on a silicon interconnection substrate at 5000 RPM for 40 seconds. The resulting photoresist thickness was 5.5 µm. Since UBM layers are typically 0.5–1.0 µm thick, the photoresist layer should be substantially thicker, e.g. more than 0.2 µm thicker, than the UBM layer to ensure proper lift-off.

The wafer was then baked on a hot plate at 90° C. for 2 minutes. The resulting wafer was placed in a lithography tool and exposed to a pattern with actinic light at 465 nm with an overall light energy of 400 mj/cm². The exposed wafer was then baked at 105° C. for 30 minutes followed by a flood exposure of the whole wafer surface with 465 nm light and a total energy of 1500 mj/cm². The photolithographic pattern was then developed in 400K developer (3:1) for 4.5 minutes, rinsed in DI water, and dried. The post lithography radiation treatment was a flood exposure of the wafer to 365 nm light with a total accumulated energy of 75 j/cm². The exposure was followed by a hard bake for 1 hour at 150° C. The resulting pattern was found to be robust, and was essentially unaffected by subsequent thermal processing.

The additive used in the positive photoresist in the above example was an organic base, Imidazole. However, other bases can also be used.

In the foregoing description of the process of the invention solder bumps are suggested as the specific means for attaching the flip chip to an interconnection substrate. Other forms of soldering can also be used, such as solder paste. Typically both substrates being joined will be provided with UBM however, some substrates, for example copper printed circuit boards, have bonding regions that may not require UBM in which case the process of the invention may be applied to only one substrate being joined.

Also in the foregoing description the lift-off technique of the invention is described in the context of making solder bump patterns for flip-chip bonding. However, it will be recognized by those skilled in the art that the improved dimensional stability produced by treating a lift-off resist using the technique of the invention has application to other lift-off metallization processes.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A process for the manufacture of semiconductor devices in which a metal layer on a substrate is patterned by the steps of:

(a) applying a layer of photoresist on said substrate,
   (b) patterning said layer of photoresist to form windows in said layer of photoresist,
   (c) exposing said patterned layer of photoresist to a flux of UV radiation to form a hardened patterned layer of photoresist,
   (d) depositing a metallization layer over said hardened patterned layer of photoresist and over said windows, and
   (e) removing said hardened patterned layer of photoresist from said substrate thereby patterning said metallization layer by lift-off, leaving those portions of said metallization in said windows remaining.

2. The process of claim 1 in which said metallization layer is deposited by sputtering.

3. The process of claim 2 in which said photoresist is heated to a temperature above 100° C. during the process.

4. A process for the manufacture of semiconductor devices in which a layer of metallization on a substrate is patterned using lift-off comprising the steps of:

a. spin-coating a layer of photoresist on said substrate, said layer of photoresist having a first thickness $t_1$,
   b. exposing said layer of photoresist to a pattern of actinic radiation, said radiation having a first flux level $f_1$,
   c. developing the exposed layer of photoresist to form a patterned photoresist layer with openings in the photoresist layer exposing portions of said substrate,
   d. exposing the patterned photoresist layer to a flux of actinic radiation with a flux level $f_2$, where $f_2$ is substantially greater than $f_1$,
   e. sputtering a layer of metallization over said photoresist layer, said layer of metallization having a second thickness $t_2$, where $t_2$ is substantially less than $t_1$ thereby forming metal layers on said substrate in said openings and a metal layer on said photoresist layer, with a space between the metal layers on said substrate and the metal layer on said photoresist layer, f. removing said photoresist layer and said metal layer on the photoresist layer.

5. The process of claim 4 in which the substrate is a silicon interconnect substrate.

6. The process of claim 4 in which $f_2$ is at least 5 times great than $f_1$.

7. The process of claim 4 in which the actinic radiation in step d. is UV radiation.

8. A process for the manufacture of flip-chip bonded semiconductor device packages in which a first substrate is bonded to another substrate using solder and said first substrate is provided with under bump metallization, the process comprising the steps of:

a. applying a layer of photoresist on said first substrate, b. patterning said photoresist to form windows in said photoresist, c. exposing said patterned photoresist to a flux of UV radiation, d. depositing a layer of under bump metallization over said patterned photoresist, e. patterning said layer of under bump metallization by lift-off, leaving those portions of said under bump metallization layer in said windows remaining, and f. solder bonding said substrate to another substrate.

9. A process for the manufacture of flip-chip bonded semiconductor device packages in which a solder bumped substrate is bonded to another substrate and the solder bumps on the solder bumped substrate are provided with under bump metallization, the process comprising the steps of:

a. applying a layer of photoresist on said solder bumped substrate, b. patterning said photoresist to form windows in said photoresist, c. exposing said patterned photoresist to a flux of UV radiation, d. depositing a layer of under bump metallization over said patterned photoresist, e. patterning said layer of under bump metallization by lift-off, leaving those portions of said under bump metallization layer in said windows remaining, and f. depositing said solder bumps on said remaining portions of said under bump metallization layer.

10. The process of claim 9 in which the under bump metallization is deposited by sputtering.

11. The process of claim 10 in which the deposition of under bump metallization is preceded by back sputtering the solder bumped substrate.

12. The process of claim 9 in which the flux of UV radiation is in the range 10–200 joules/cm$^2$.

13. A process for the manufacture of flip-chip bonded semiconductor devices comprising the steps of:

a. forming a plurality of I/O contact pads on a first substrate, b. depositing a layer of under bump metallization on said I/O contacts by the steps of:

i. spin-coating a layer of photoresist on said first substrate covering said I/O contacts, said layer of photoresist having a first thickness $t_1$, ii. exposing said layer of photoresist to a pattern of actinic radiation, said radiation having a first flux level $f_1$, iii. developing the exposed layer of photoresist to form openings in the photoresist layer, said openings exposing said I/O contacts, iv. exposing the patterned photoresist layer to a flux of actinic radiation with a flux level $f_2$, where $f_2$ is substantially greater than $f_1$, v. sputtering a layer of under bump metallization over said photoresist layer, said layer of under bump metallization having a second thickness $t_2$, where $t_2$ is substantially less than $t_1$ thereby forming metal layers on said I/O contacts and a metal layer on said photoresist layer, with a space between the metal layers on said I/O contacts and the metal layer on said photoresist layer, vi. removing said photoresist layer and said metal layer on the photoresist layer, c. depositing solder on the under bump metallization, and d. attaching said first substrate to another substrate by heating the solder to bond the substrates together.

14. The process of claim 13 in which said first substrate is a silicon interconnect substrate.

15. The process of claim 13 in which the solder on the under bump metallization comprises solder bumps.

16. The process of claim 13 in which $f_2$ is at least 5 times great than $f_1$.

17. The process of claim 13 in which the actinic radiation in step ii. is UV radiation.

18. The process of claim 17 in which the radiation in step iv. is UV radiation and $f_2$ is in the range 10–200 joules.

19. The process of claim 13 in which the said openings are reverse angle openings.

20. The process of claim 19 in which the photoresist is a positive resist mixed with a base.

21. The process of claim 13 in which the sputtering of under bump metallization is preceded by back sputtering the solder bumped substrate.

22. The process of claim 13 in which the layer of photoresist is heated to a temperature greater than 100° C. during the process.

23. The process of claim 20 in which the base is Imidazole.

* * * * *